(12) United States Patent
Chen et al.

(10) Patent No.: US 11,508,783 B2
(45) Date of Patent: Nov. 22, 2022

(54) METHOD FOR FABRICATING MEMORY DEVICE

(71) Applicant: United Microelectronics Corp., Hsinchu (TW)

(72) Inventors: Chung-Tse Chen, Hsinchu (TW); Ko-Chi Chen, Taoyuan (TW); Tzu-Yun Chang, Hsinchu County (TW)

(73) Assignee: UNITED MIICROELECTRONICS CORP., Hsinchu (TW)

( * ) Notice: Subject to any disclaimer, the term of this patent is extended or adjusted under 35 U.S.C. 154(b) by 16 days.

(21) Appl. No.: 17/235,785

(22) Filed: Apr. 20, 2021

(65) Prior Publication Data

US 2021/0242282 A1 Aug. 5, 2021

Related U.S. Application Data

(62) Division of application No. 16/418,770, filed on May 21, 2019, now Pat. No. 11,024,672.

(30) Foreign Application Priority Data

Apr. 15, 2019 (CN) .......................... 201910299005.1

(51) Int. Cl.
*H01L 27/24* (2006.01)
*H01L 45/00* (2006.01)

(52) U.S. Cl.
CPC ...... *H01L 27/2463* (2013.01); *H01L 27/2436* (2013.01); *H01L 45/16* (2013.01); *H01L 45/06* (2013.01); *H01L 45/08* (2013.01); *H01L 45/1233* (2013.01); *H01L 45/1253* (2013.01)

(58) Field of Classification Search
CPC . H01L 27/2463; H01L 27/2436; H01L 45/16; H01L 45/06; H01L 45/08; H01L 45/1233; H01L 45/1253; H01L 45/04; H01L 27/249; H01L 45/12; G11C 13/0002; G11C 13/0004
See application file for complete search history.

(56) References Cited

U.S. PATENT DOCUMENTS

| | | | |
|---|---|---|---|
| 7,561,460 B2 | 7/2009 | Liaw et al. | |
| 9,697,874 B1 | 7/2017 | Asnaashari et al. | |
| 10,157,962 B2 | 12/2018 | Chen et al. | |
| 2009/0196095 A1 | 8/2009 | Liu | |
| 2016/0351623 A1 | 12/2016 | Chen et al. | |
| 2017/0352415 A1 | 12/2017 | Harvard | |
| 2019/0229264 A1 | 7/2019 | Karpov et al. | |
| 2019/0267081 A1 | 8/2019 | Luo et al. | |
| 2020/0098985 A1 | 3/2020 | Trinh et al. | |

FOREIGN PATENT DOCUMENTS

| | | |
|---|---|---|
| EP | 1630817 | 3/2006 |
| EP | 3101689 | 12/2016 |

OTHER PUBLICATIONS

Chih-Wei Stanley Yeh, et al., "Compact One-Transistor-N-RRAM Array Architecture for Advanced CMOS Technology." IEEE Journal of Solid-State Circuits, vol. 50, No. 5, May 2015, pp. 1299-1309.

*Primary Examiner* — Julia Slutsker
(74) *Attorney, Agent, or Firm* — J.C. Patents

(57) ABSTRACT

A method for fabricating memory device is provided. The method includes forming a transistor on a substrate. Further, a contact structure is formed on a source/drain region of the transistor. A conductive layer is formed on the contact structure. Four memory structures are formed on the conductive layer to form a quadrilateral structure.

7 Claims, 6 Drawing Sheets

METHOD FOR FABRICATING MEMORY DEVICE

CROSS-REFERENCE TO RELATED APPLICATION

This application is a divisional application of and claims the priority benefit of U.S. patent application Ser. No. 16/418,770, filed on May 21, 2019, now allowed. The prior application Ser. No. 16/418,770 claims the priority benefit of China application serial no. 201910299005.1, filed on Apr. 15, 2019. The entirety of the above-mentioned patent applications is hereby incorporated by reference herein and made a part of this specification.

BACKGROUND

1. Field of the Invention

The present invention generally relates to semiconductor fabrication technology, and particularly to a method for fabricating the memory device.

2. Description of Related Art

Non-volatile memory device is almost the necessary part in digital electronic products. The digital electronic products, such as computer, mobile phone, camera, video recorder and so on, are also indispensable products in daily life. Thus, the non-volatile memory device is generally required.

Further due to a great development of multi-media in an example, the amount of stored data as needed is also accordingly increasing. In this situation, the development for designing the non-volatile memory is still proceeded, so to increase the storage capability for the limited device area. In other words, the device area occupied by the memory cell should be reduced.

In the developing technology, the resistive memory has been proposed. The resistive memory material in the structure of the resistive memory cell may vertically extend from the substrate to form the memory cell, so that the use of device area may be reduced. The property of resistive memory material is changing the conductive state of the resistive memory material by applying the operation bias, in which the resistance levels exits two states, so to be used for storing binary data.

Based on the structure of resistive memory device, it is still under developing that multiple memory cells may commonly share one control transistor.

SUMMARY OF THE INVENTION

The invention provides a method for fabricating the memory device. The memory device is based on the vertical memory structure and one transistor may be shared by multiple memory cells. In an example, four memory cells may share one transistor.

In an embodiment, the invention provides a method for fabricating memory device. The method comprises forming a transistor on a substrate. Further, a contact structure is formed on a source/drain region of the transistor. A conductive layer is formed on the contact structure. Four memory structures are formed on the conductive layer to form a quadrilateral structure.

In an embodiment, as to the method for fabricating memory device, two of the four memory structures extend along a first direction as a first pair, and another two of the four memory structures extend along a second direction as a second pair, the first direction intersects the second direction.

In an embodiment, as to the method for fabricating memory device, the method further comprises forming four interconnection lines, respectively connected to the four memory structures.

In an embodiment, as to the method for fabricating memory device, the method further comprises forming a first pair of interconnection lines, respectively connected to the first pair of the four memory structures; and forming a second pair of interconnection lines, respectively connected to the second pair of the four memory structures.

In an embodiment, as to the method for fabricating memory device, the first pair of interconnection lines is higher than the second pair of interconnection lines, wherein the first pair of interconnection lines has a protruding portion to contact the first pair of the four memory structures.

In an embodiment, as to the method for fabricating memory device, each of the four memory structures is a resistive memory structure or a phase-change memory structure.

In an embodiment, as to the method for fabricating memory device, the conductive layer is single layer.

In an embodiment, as to the method for fabricating memory device, the step of forming the conductive layer comprises forming a metal layer on the contact structure and forming a via layer on the metal layer, wherein the first pair of the memory structures and the second pair of the memory structures are disposed on the via layer.

In an embodiment, as to the method for fabricating memory device, the via layer has a concave at a central region surrounded by a peripheral region, and the four memory structures are disposed on the via layer at the peripheral region.

In an embodiment, as to the method for fabricating memory device, the step of forming the four memory structures comprises forming a bottom electrode on the conductive layer; and forming a top electrode over the bottom electrode.

In an embodiment, as to the method for fabricating memory device, the method further comprises forming a first pair of interconnection lines respectively connected to the top electrode of each of a first pair of the four memory structures, and forming a second pair of interconnection lines respectively connected to the top electrode of each of a second pair of the four memory structures.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to semiconductor fabricating technology, in which the structure and the fabrication method for memory device is related to. The structure of memory device includes one transistor which may be at least shared by four memory structure in an example.

Several embodiments are provided for describing the invention, but the invention is not limited to the embodiments as provided. Further, the invention does not exclude a proper combination between the embodiments.

Figure 1:
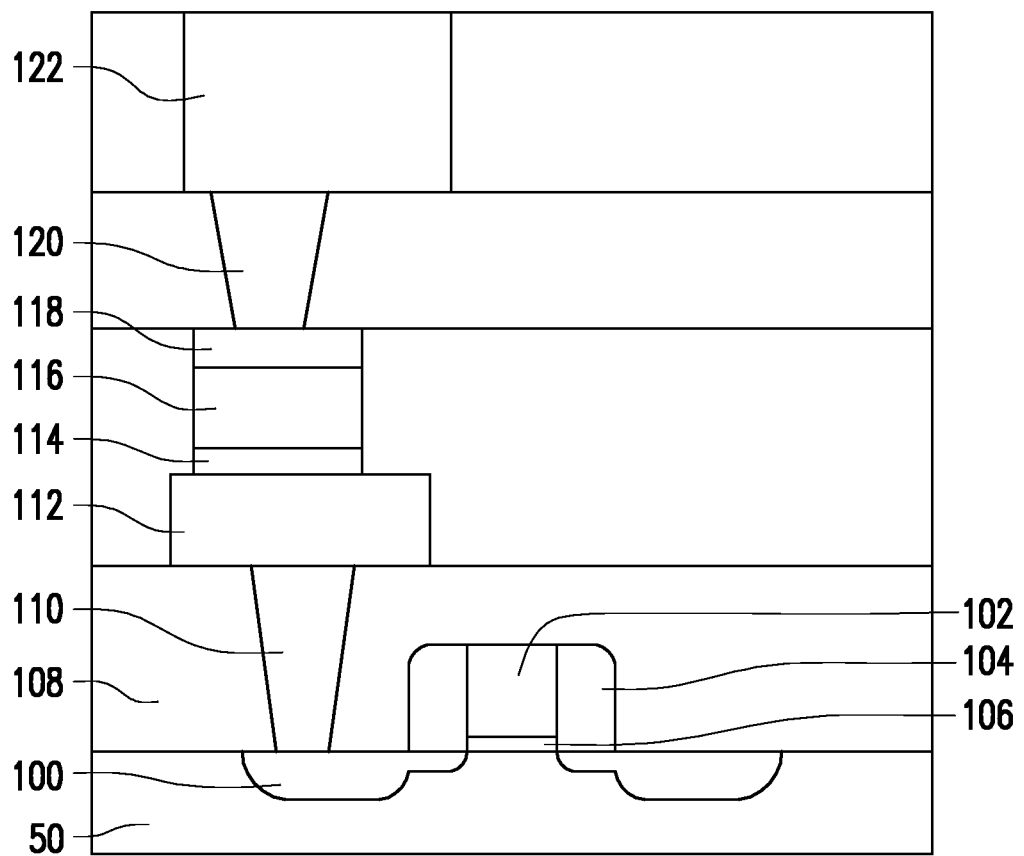
FIG. 1 is a drawing in cross-sectional view, schematically illustrating a structure of vertical memory device as being looked into, according to an embodiment of the invention.

The invention firstly looks into a vertical memory device. FIG. 1 is a drawing in cross-sectional view, schematically illustrating a structure of vertical memory device as being looked into, according to an embodiment of the invention.

Referring to FIG. 1, to a memory cell of the memory device, the usual implementation is that one transistor is corresponding to one memory structure. A transistor is formed on the substrate 50. The basic structure of the transistor includes a gate insulating layer 106, a gate electrode 102 on the gate insulating layer 106, a spacer 104 on the sidewall of the gate 102 and source/drain regions 100 in the substrate 50 at both sides of the gate electrode 102.

In fabrication, an inter-layer dielectric (ILD) layer 108 may covers over the substrate 50. A contact structure 110 is formed in the inter-layer dielectric layer 108 to contact in connection with the source/drain regions 100. An interconnection layer 112 as needed is also formed on the inter-layer dielectric layer 108 to connect another end of the contact structure 110.

A memory structure is on the interconnection layer 112. The memory structure includes a memory material layer 116. In addition, a bottom electrode 114 and a top electrode 118 may also be included on the memory material layer 116, so for external connection. A via structure 120 may also be on the top electrode 118. Another end of the via structure 120 is further connected to the interconnection layer 122. As usually known, due to the need in fabrication, the memory structure and the interconnection layer 112, 122 are enclosed by the inter-layer dielectric layer. The detail is not described here.

After looking into the structure of memory device in FIG. 1, the invention has observed that the device area used by the structure of the vertical memory device is mainly determined by the device area used by the transistor. Howe to make multiple memory cells to share one transistor is one of the concerning issues in developing trend. The invention provides a design structure in which multiple memory cells share one transistor.

Figure 2:
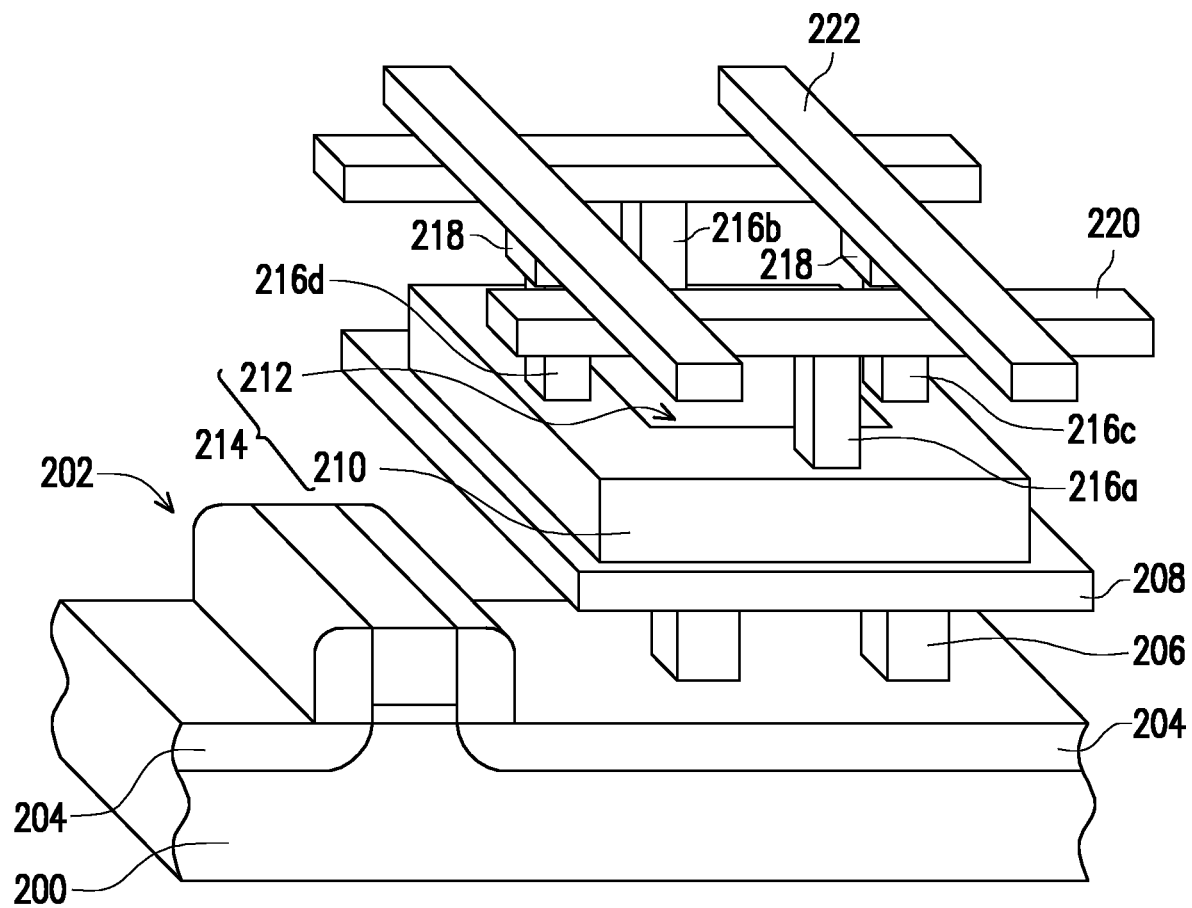
FIG. 2 is a drawing in a perspective view, schematically illustrating a structure of vertical memory device, according to an embodiment of the invention.

FIG. 2 is a drawing in a perspective view, schematically illustrating a structure of vertical memory device, according to an embodiment of the invention. Referring to FIG. 2, the structure of the memory device as provided in the invention includes a transistor 202 formed on the substrate 200. The contact structure 206 is disposed on the source/drain region 204 of the transistor 202. A conductive layer including the metal layer 208 and the via layer 214 in an example is disposed on the contact structure 206. The number of the contact structure 206 as actually needed may be single or multiple. In an embodiment, the number of the contact structure 206 is two as an example. In an embodiment, the metal layer 208 of the conductive layer is disposed on the contact structure 206 with contact and is indirectly connected to the transistor 202.

The four memory structures 216a, 216b, 216c, 216d are disposed on the via layer 214 of the conductive layer, to form a quadrilateral structure. Here, the inter-layer dielectric structure used to support the foregoing device elements during the fabrication is known in the ordinary art, the description in detail is omitted here.

In an embodiment, the conductive layer is formed by the metal layer 208 and the via layer 214 as stacked. In another embodiment, the conductive layer may be a single-layer structure. The use of the metal layer 208 is to improve the stable connection with contact structure 206. The via structure 214 has is helpful to support the four memory structures 216a, 216b, 216c, 216d and is connected to the metal layer 208, and then is further electrically connected to the contact structure 206.

As to the structure of the via layer 214 for supporting the four memory structures 216a, 216b, 216c, 216d, it is also used to electric coupling between the four memory structures 216a, 216b, 216c, 216d and the source/drain region 204 of the transistor. In an embodiment, the via layer 214 has an indent 212 at the central region in an example, surrounded by the peripheral region 210. Thus, the four memory structures 216a, 216b, 216c, 216d are disposed on the peripheral region 210.

In an embodiment, two memory structures 216a, 216b of the four memory structures 216a, 216b, 216c, 216d may be formed as a pair, and another memory structures 216c, 216d of the four memory structures 216a, 216b, 216c, 216d may be formed as another pair. The pair of memory structures 216a, 216b are respectively connected to two interconnection lines 220. The interconnection lines 220 are extending along one direction. Another pair of memory structures 216c, 216d are respectively connected to another two interconnection lines 222. The interconnection lines 222 are extending along another direction and intersect the interconnection lines 220, such as perpendicularly intersecting. The four lines of the pair of the interconnection lines 222 and the pair of interconnection lines 220 may be respectively corresponding to the four memory structures 216a, 216b, 216c, 216d to apply the operation voltages which are for writing, reading or erasing operation.

Since the extending directions of the interconnection lines 222 and the interconnection lines 220 are different, resulting in intersection, the height as disposed in an embodiment may be different, so to avoid the short circuit due to contact. In an embodiment as an example, the pair of interconnection lines 222 corresponding to the pair of memory structures 216c, 216d may include a protruding part 218, so that the pair of the interconnection lines 222 would be higher than the pair of the interconnection lines 220, without contacting to each other. However, the invention is not limited to the embodiment.

Figure 3A:
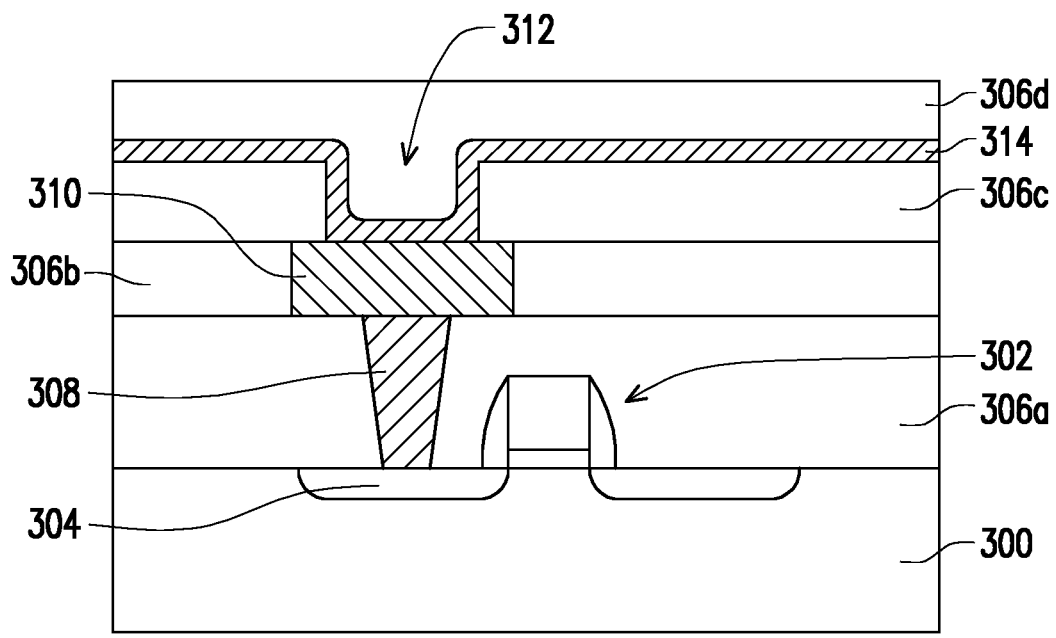
FIG. 3A to FIG. 3C are drawings in cross-sectional view, schematically illustrating a processing flow of fabricating the memory device, according to an embodiment of the invention.
Figure 3B:
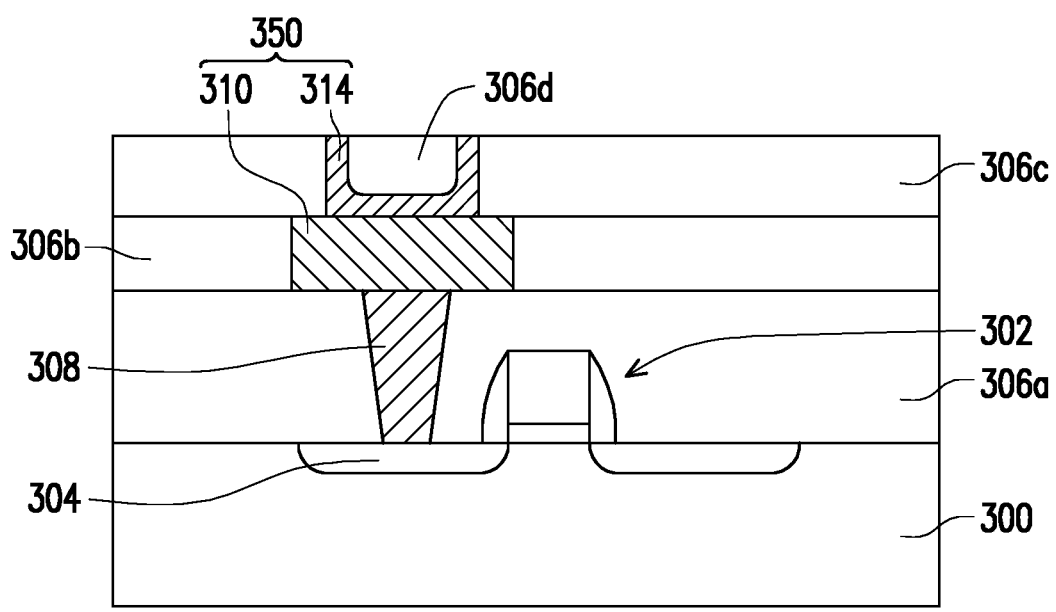
Figure 3C:
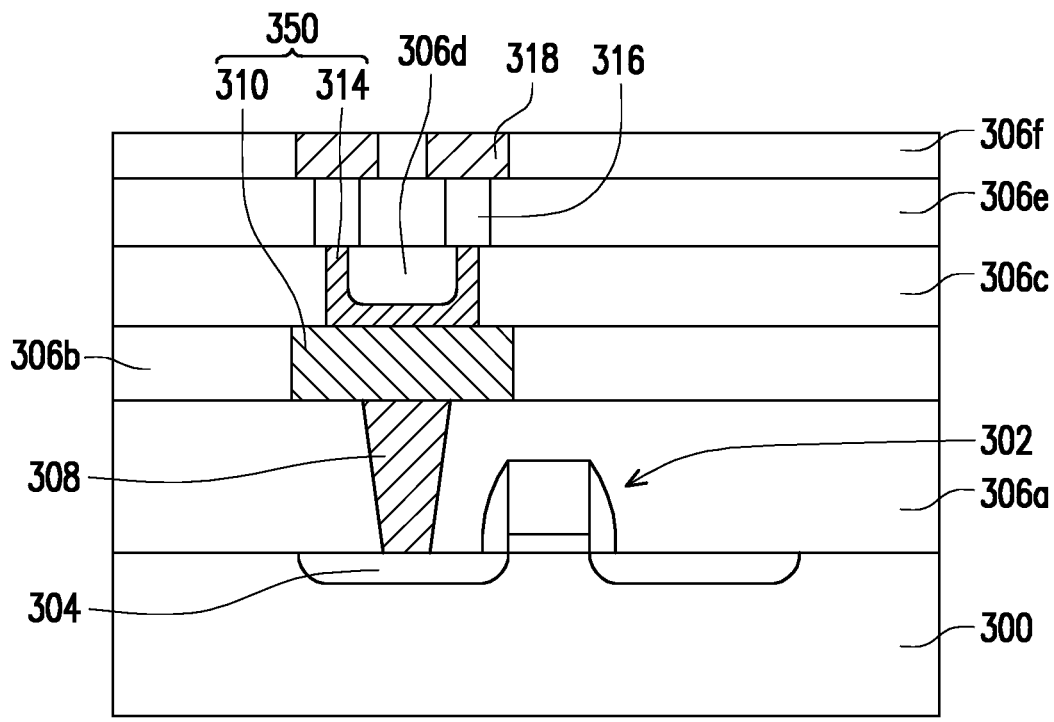

The fabrication process flows are subsequently described. FIG. 3A to FIG. 3C are drawings in cross-sectional view, schematically illustrating a processing flow of fabricating the memory device, according to an embodiment of the invention.

Referring to FIG. 3A, the substrate 300 as provided is used to firstly fabricate a transistor 302 on the substrate 300. The transistor 302 includes the source/drain region 304 in the substrate 300. The inter-layer dielectric layer 306a is formed on the substrate 300 to cover over the transistor 302. A contact structure 308 is formed in the inter-layer dielectric layer 306a in contacting with the source/drain region 304. A further inter-layer dielectric layer 306b is formed on the inter-layer dielectric layer 306a. A metal layer 310 is formed in the inter-layer dielectric layer 306b to contact with the contact structure 308, so to have the connection.

In an embodiment, a via layer may be further formed in the metal layer 310 to support the memory structures. In the formation of the via layer in the semiconductor fabrication flow, a further inter-layer dielectric layer 306c is formed on the inter-layer dielectric layer 306b. The inter-layer dielectric layer 306c has an opening 312 to expose the metal layer 310. A via conductive layer 314 as to be subsequently formed into the via layer is formed in the inter-layer dielectric layer 306c. The via conductive layer 314 is also covering over the sidewall of the opening 312 and the exposed portion of the metal layer 310. Another inter-layer dielectric layer 306d is formed on the inter-layer dielectric layer 306c, also filling into the indent corresponding to the opening 312.

Referring to FIG. 3B, through the polishing process, a portion of the inter-layer dielectric layer 306d and the via conductive layer 314 above the inter-layer dielectric layer 306c is removed. As a result, the remaining portion of the via conductive layer 314 forms the conductive layer 214 as shown in FIG. 2. The inter-layer dielectric layer 306d inside the opening 312 may still have the residual portion, so that a flat plane is obtained.

In an embodiment, the metal layer 310 and the via conductive layer 314 may be generally treated as a conductive layer 350. As viewed to the structure, the conductive layer 350 may be a single layer or a combination of the metal layer 310 and the via conductive layer 314, in an example. In addition, the via conductive layer 314 serving as the via layer in an embodiment may need no the indent at the central region corresponding to the opening 312. The conductive layer 350 may be adjusted according to the actual design in need.

Referring to FIG. 3C, an inter-layer dielectric layer 306e is formed on the inter-layer dielectric layer 306d. The memory structure 316 is formed in the inter-layer dielectric layer 306e and contacts with the conductive layer 350, such as contacting the via conductive layer 314 serving as the via layer, to have the connection. The memory structure 316 in an example includes memory material for the resistive memory structure or the phase change memory structure.

After planarization, the inter-layer dielectric layer 306f is further formed on the inter-layer dielectric layer 306e. The structure of the interconnection line 318 is subsequently formed in the inter-layer dielectric layer 306f to connect the memory structure 316. As to the embodiment in FIG. 2, the interconnection lines 318 have four lines, in which a pair of the interconnection lines 318 is shown in this cross-sectional structure.

Figure 4:
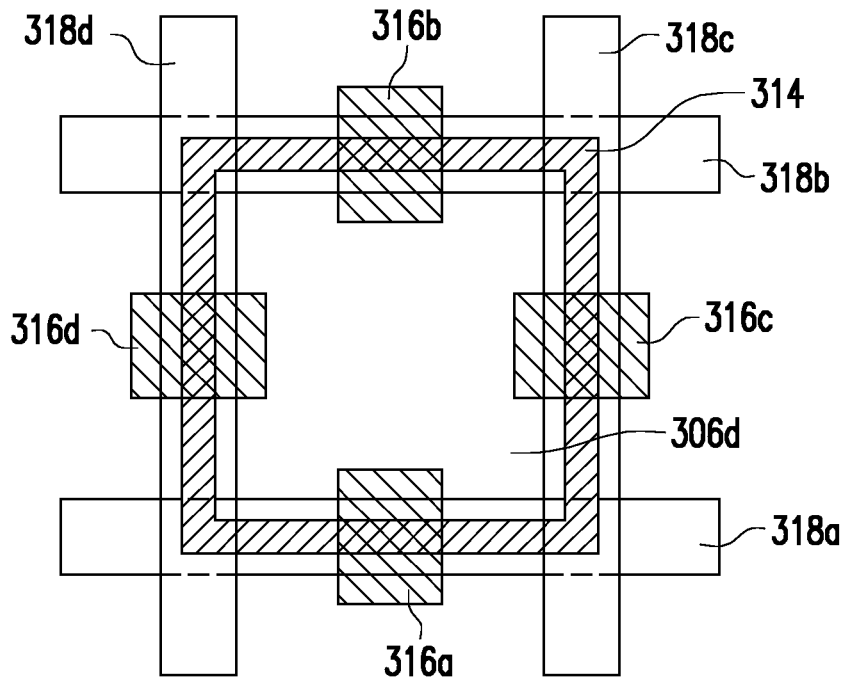
FIG. 4 is a drawing in a top view, schematically illustrating a portion of the structure of the memory device, according to an embodiment of the invention.

As to the layout of the memory structurers 316 on the conductive layer 350 may have various manners. FIG. 4 is a drawing in a top view, schematically illustrating a portion of the structure of the memory device, according to an embodiment of the invention. Referring to FIG. 4, when the via conductive layer 314 serving as the via layer may have the indent structure at the central region, in an example. The indent is filled by the inter-layer dielectric layer 306d. The peripheral region of the via conductive layer 314 in an example is shown in FIG. 4, taking the quadrilateral geometric structure as an example. The four memory structures 316a, 316b, 316c, 316d are respectively located at four sides of the quadrilateral structure, in contact with the via conductive layer 314 as shared. Four interconnection lines 318a, 318b, 318c, 318d are respectively located above the memory structures 316a, 316b, 316c, 316d with contact. In the embodiment, the pair of interconnection lines 318a, 318b in an example is higher than the pair of interconnection lines 318c, 318d.

Figure 5:
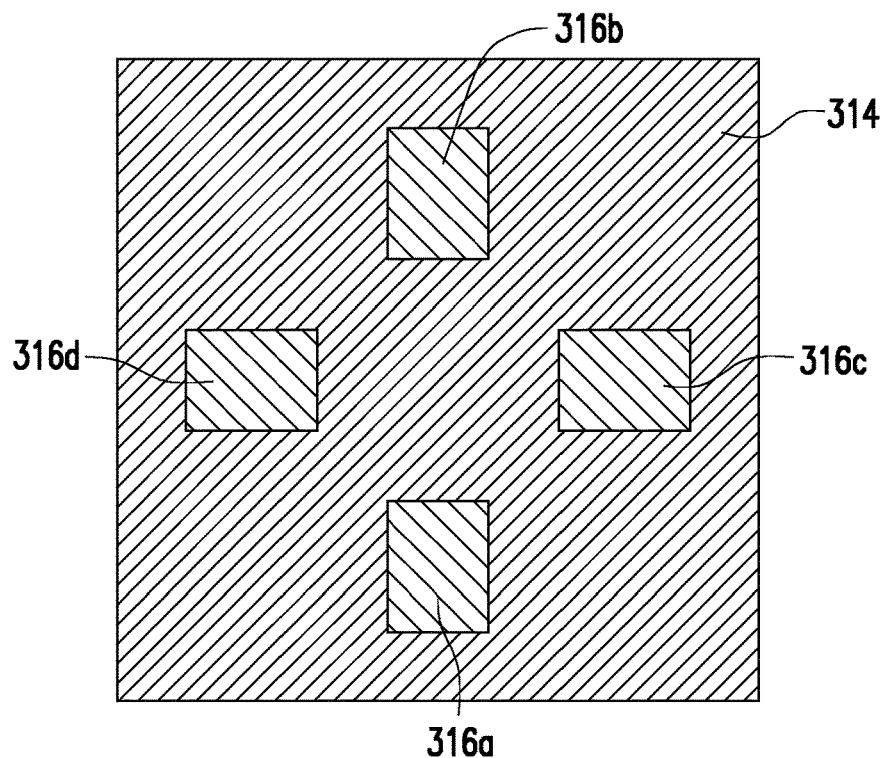
FIG. 5 is a drawing in a plane view, schematically illustrating a layout of the memory device, according to an embodiment of the invention.

With the similar aspect, the implementation of the via conductive layer 314 and the memory structures 316a, 316b, 316c, 316d is not just limited to the embodiments and may have other modifications. FIG. 5 is a drawing in a plane view, schematically illustrating a layout of the memory device, according to an embodiment of the invention. Referring to FIG. 5, the surface of the via conductive layer 314 may be flat without indent, in which there is no the inter-layer dielectric layer 306d shown in FIG. 4. The locations of the memory structures 316a, 316b, 316c, 316d may be at proper locations of the via conductive layer 314, such as at the center region for each of the four sides. In an embodiment, the conductive layer 350 as stated above in an integration may be the via conductive layer 314 as a single layer.

Figure 6:
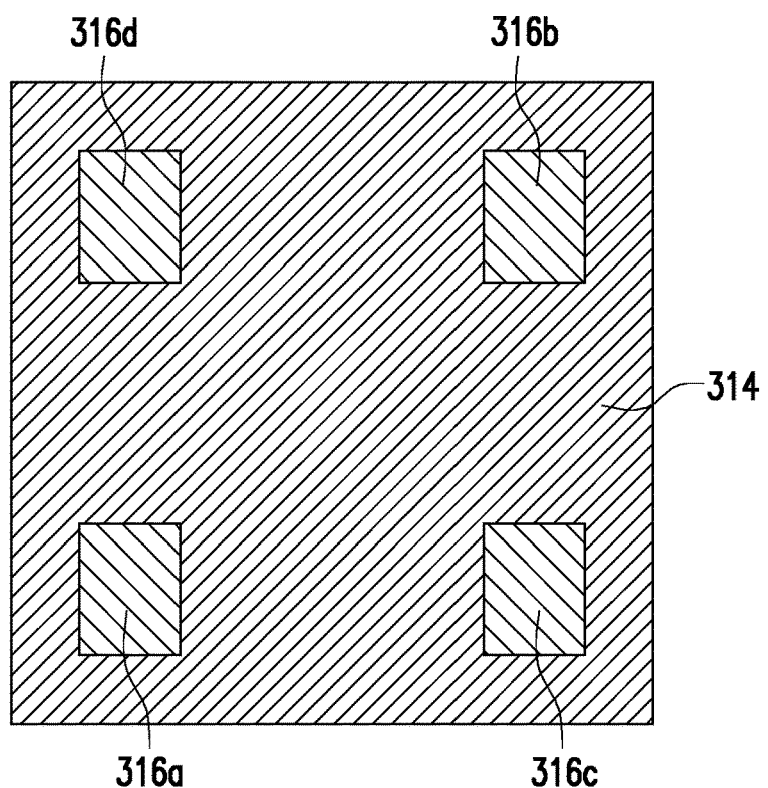
FIG. 6 is a drawing in a plane view, schematically illustrating a layout of the memory device, according to an embodiment of the invention.

FIG. 6 is a drawing in a plane view, schematically illustrating a layout of the memory device, according to an embodiment of the invention. Referring to FIG. 6, the locations of the memory structures 316a, 316b, 316c, 316d may also be on the four corners of the via conductive layer 314.

Figure 7:
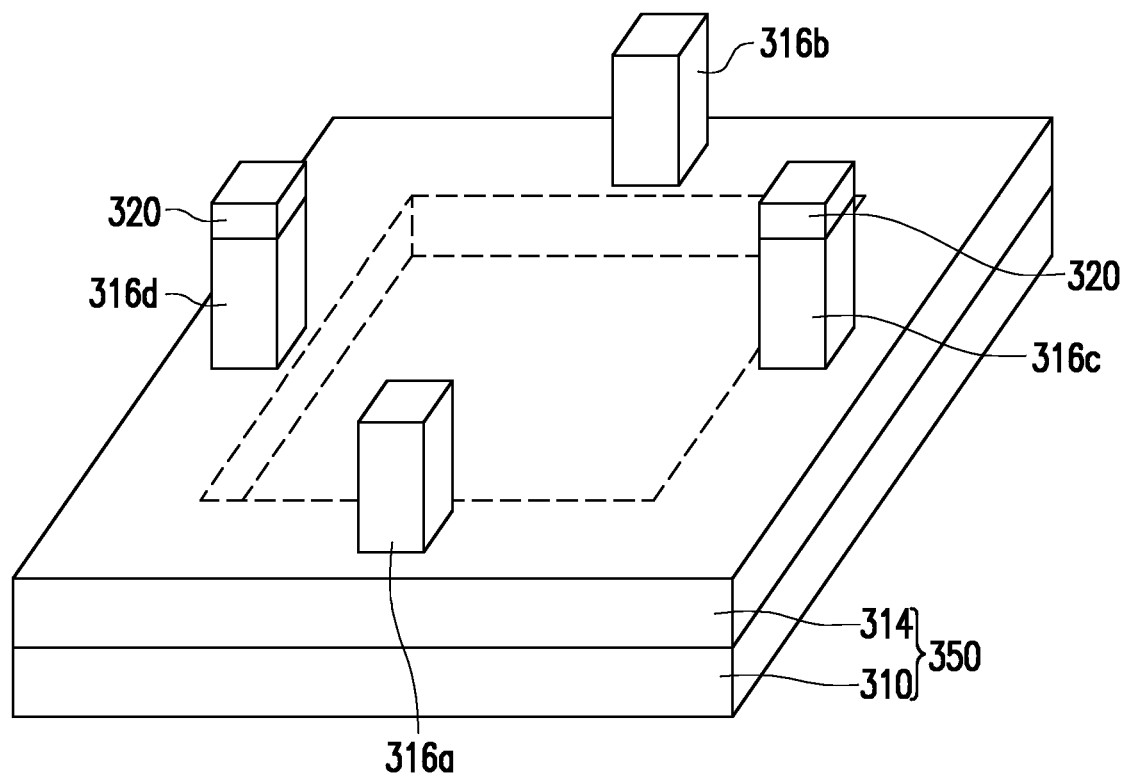
FIG. 7 is a drawing in a perspective view, schematically illustrating a layout of the memory device, according to an embodiment of the invention.

FIG. 7 is a drawing in a perspective view, schematically illustrating a layout of the memory device, according to an embodiment of the invention. Referring to FIG. 7, the implementation of the interconnection lines 318a, 318b, 318c, 318d is further described. In an embodiment, to adapt the heights of the interconnection lines 318a, 318b, 318c, 318d, in an example, the locations of the interconnection lines to connect to the memory structures 316c, 316d are relatively higher, so to avoid a short circuit by contact to the interconnection lines to connect to the memory structures 316a, 316b. The top of the memory structures 316c, 316d may additionally implemented with a protruding portion 320. The protruding portion 320 in an embodiment may be as a part structure of the interconnection lines.

Further to an embodiment, the memory structures may directly have different heights in accordance with the connection to the interconnection lines. In this situation, the memory structure may have different lengths, in which the operation may accordingly adjusted. The invention is not just limited to the embodiments as provided.

Further to FIG. 7, the structure as indicated by the dashed line is for the situation that the via conductive layer 314 serving as the via layer has the indent. Thus, the memory structures 316a, 316b, 316c, 316d are located at the peripheral region of the via conductive layer 314. In an embodiment, the conductive layer 350 in an example is a combination of the metal layer 310 and the via conductive layer 314. However, the conductive layer 350 may be just the via conductive layer 314 without stacking layer.

The invention uses the conductive layer 350 as shared and may support at least four memory structures 316a, 316b, 316c, 316d. The four memory structures 316a, 316b, 316c, 316d may share one transistor in operations through the conductive layer 350 as shared. As a result, four memory cells may share one transistor, the device area may remain about the device area for the transistor. The invention may effectively improve the use of the device area and would not substantially increase the complexity in fabrication processes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating memory device, comprising:
   forming a transistor on a substrate;
   forming a contact structure on a source/drain region of the transistor;
   forming a conductive layer on the contact structure;
   forming four memory structures, comprising forming a bottom electrode of each of the four memory structures on the conductive layer to form a quadrilateral structure, and forming a top electrode over the bottom electrode;
   forming a first pair of interconnection lines, respectively connected to the top electrode of each of a first pair of the four memory structures; and
   forming a second pair of interconnection lines, respectively connected to the top electrode of each of a second pair of the four memory structures.

2. The method for fabricating memory device as recited in claim 1, wherein the first pair of the four memory structures extends along a first direction, and the second pair of the four memory structures extends along a second direction, the first direction intersects the second direction.

3. The method for fabricating memory device as recited in claim 1,
   wherein the first pair of interconnection lines is higher than the second pair of interconnection lines, wherein the first pair of interconnection lines has a protruding portion to contact the first pair of the four memory structures.

4. The method for fabricating memory device as recited in claim 1, wherein each of the four memory structures is a resistive memory structure or a phase-change memory structure.

5. The method for fabricating a memory device as recited in claim 1, wherein the conductive layer is single layer.

6. The method for fabricating a memory device as recited in claim 1, wherein a step of forming the conductive layer comprises:
   forming a metal layer on the contact structure; and
   forming a via layer on the metal layer, wherein the first pair of the memory structures and the second pair of the memory structures are disposed on the via layer.

7. The method for fabricating memory device as recited in claim 6, wherein the via layer has a concave at a central region surrounded by a peripheral region, and the four memory structures are disposed on the via layer at the peripheral region.

* * * * *